United States Patent
Hori et al.

(10) Patent No.: US 7,436,664 B2
(45) Date of Patent: Oct. 14, 2008

(54) ELECTRONIC APPLIANCE

(75) Inventors: Yuji Hori, Kyoto (JP); Junji Takamoto, Kyoto (JP); Noboru Wakitani, Kyoto (JP); Yasuhisa Kitano, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 0 days.

(21) Appl. No.: 11/723,972

(22) Filed: Mar. 22, 2007

(65) Prior Publication Data

US 2008/0106866 A1 May 8, 2008

(30) Foreign Application Priority Data

Nov. 8, 2006 (JP) ............................. 2006-302508

(51) Int. Cl.
*H05K 7/20* (2006.01)
*H01L 23/36* (2006.01)

(52) U.S. Cl. ....................... 361/695; 361/697; 361/687; 361/704; 361/710; 165/80.3; 165/121; 165/185; 454/184

(58) Field of Classification Search ................. 361/685, 361/687, 690–697, 702–712, 715, 719–721; 165/80.2, 80.3, 80.4, 104.33, 121–127, 185; 454/184; 257/706, 707, 712, 713, 722; 174/16.1, 174/16.3, 252
See application file for complete search history.

(56) References Cited

U.S. PATENT DOCUMENTS 6,034,870 A * 3/2000 Osborn et al. ............... 361/690
6,317,319 B1 * 11/2001 Lewis et al. ................. 361/695
6,442,024 B1 * 8/2002 Shih ........................... 361/695
6,466,448 B1 * 10/2002 Baik ........................... 361/752
6,650,536 B2 * 11/2003 Lee et al. ..................... 361/687
6,742,573 B2 * 6/2004 Sasaki et al. ................ 165/80.3
6,999,312 B1 * 2/2006 Garnett et al. .............. 361/687
7,027,299 B2 * 4/2006 Wrycraft et al. ............ 361/695
7,120,018 B2 * 10/2006 Shen et al. .................. 361/695
7,167,360 B2 * 1/2007 Inoue et al. ................. 361/685

FOREIGN PATENT DOCUMENTS

JP    1985-22398    2/1985
JP    2004-186702   7/2004

* cited by examiner

*Primary Examiner*—Michael V Datskovskiy
(74) *Attorney, Agent, or Firm*—Nixon & Vanderhye, PC

(57) ABSTRACT

In an electronic appliance, a base is thermally fused by a heat generating component. On the base, a heat dissipating fin group including heat dissipating fins each extending in a Y direction is arranged in spaced relation in an X direction. An exhaust fan and a partition between which the heat dissipating fin group is sandwiched in the Y direction are arranged so as to be faced with each other. The edge portion group of the heat dissipating fin group on the side of the partition is farthest from the wall surface at least one outermost position in the X direction and closest from the wall surface at a specific position different from the one outermost position, and is farther from the wall surface between the specific position and the one outermost position as the one outermost position is approached.

14 Claims, 11 Drawing Sheets (A)

(B)

(C)

ELECTRONIC APPLIANCE

CROSS REFERENCE OF RELATED APPLICATION

The disclosure of Japanese Patent Application No. 2006-302508 is incorporated herein by reference.

BACKGROUND OF THE INVENTION

1. Field of the Invention

The present invention relates to an electronic appliance. More specifically, the present invention relates to an electronic appliance having a heat dissipating mechanism for dissipating heat in a heat generating component.

2. Description of the Related Art

As a conventional structure of such a kind, there is one disclosed in Japanese Patent Laying-open No. 1985-22398 (Patent Document 1). Acceding to Patent Document 1, heat dissipating fins are secured to a base to be attached to a heat generating component to allow air to flow through one end of the heat dissipating fins to the other. The heat dissipating fin group becomes higher from the entrance side from where air is taken in to the exit side from where the air is exhausted. Since the temperature of the air flowing along the heat dissipating fins is high as the exit is approached, the heat dissipating fin group is formed so as to be higher to the exit side, capable of obtaining high heat dissipating efficiency.

Furthermore, there is one disclosed in Japanese Patent Laying-open No. 2004-186702 (Patent Document 2). According to Patent Document 2, a plurality of heat dissipating fins are arranged in series with each other on a base to be attached to a heat generating component. A wall surface is provided so as to face the base in such a manner that the plurality of heat dissipating fins are sandwiched therebetween, and an air duct is formed between the wall surface and the base. An exhaust fan is provided on the exit side of the air duct, and the air duct between the wall surface and the base becomes narrower as the exit side is approached. Thus, by widening the entrance side of the air duct, air being free from the heat dissipation by the heat dissipating fins at the entrance side is supplied with the heat dissipating fins at the exit side, capable of realizing a uniform cooling performance of each heat dissipating fin.

By the way, in electronic appliances like a game machine, etc., for the necessity of miniaturization and an optimal location, some members (wall member, component, or the like) may be arranged relatively near heat dissipating fins and heat generating components. In such a case, there is a problem of realizing a structure in view of the heat by the heat generating components.

For example, there is a case that some wall member (wall surface, component with wall part, or the like) is desired to be arranged on the entrance side of the air of the heat dissipating fin. In this case, an air intake channel to the heat dissipating fin may relatively be narrow due to the above-described wall member, and in such a case also, there is a problem of heightening the heat dissipating efficiency of the heat generating component.

Furthermore, there is a case that other components such as a disk drive, or the like is desired to be placed relatively near heat generating components, for example. In this case, there is a problem of preventing an adverse effect of the heat from the heat generating component on the other components.

In Patent Documents 1 and 2, there is no disclosure about means for solving the above described problems.

SUMMARY OF THE INVENTION

Therefore, it is a primary object of the present invention to provide a novel electronic appliance.

Another object of the present invention is to provide a structure taking heat of a heat generating component into consideration while responding to the necessity of miniaturization and an optimal location.

An electronic appliance according to a first aspect of the present invention comprises: a heat generating component; a base provided in a position being opposite to the heat generating component; a heat dissipating fin group which includes a plurality of fins arranged on the base in a manner that each of heat dissipating fins extends in a first direction (Y) and is arranged in spaced relation in a second direction (X) crossing the first direction, edge portions of the plurality of heat dissipating fins constituting edge portion groups on the side of a wall surface and on the side of an exhaust fan; and the exhaust fan and the wall surface being opposite to each other with which the heat dissipating fin group is sandwiched in the first direction. The edge portion group (T2) of the heat dissipating fin group on the side of the wall surface is farthest from the wall surface at least one outermost position in the second direction and closest from the wall surface at a specific position different from the one outermost position in the second direction, and is farther from the wall surface between the specific position and the one outermost position as the one outermost position is approached.

In the first aspect, on the base being opposite to the heat generating component, a heat dissipating fin group including heat dissipating fins each of which extends in a first direction is arranged in spaced relation in a second direction. It should be noted that "the base being opposite to the heat generating component" includes a structure when a part of the heat generating component and a part of the base is being opposite. An exhaust fan and a wall surface are opposite to each other with which the heat dissipating fin group is sandwiched in the first direction.

The edge portion group of the heat dissipating fin group on the side of the wall surface is farthest from the wall surface at least one outermost position in the second direction and closest from the wall surface at a specific position different from the one outermost position in the second direction, and is farther from the wall surface between the specific position and the one outermost position as the one outermost position is approached.

According to the first aspect, one or two intake channels (QL, QR) is formed by the edge portion group of the heat dissipating fin group on the side of the wall surface and the wall surface. The (these) intake channel can take a large amount of outside air because of having a large opening, and can uniformly supply the taken air to the heat dissipating fin group because the width thereof is narrower at the depth. In such a case, the amount of air passing through the intake channel is gradually less, and therefore, the depth of the intake channel does not become a bottle neck. Thus, it is possible to obtain a high heat dissipating efficiency with respect to the heat dissipating component arranged near the wall surface.

As a result, it is possible to heighten heat dissipating efficiency of the heat generating component while responding to the necessity of miniaturization and an optimal location.

An electronic appliance according to a second aspect is dependent on the first aspect, and the edge portion group on the side of the wall surface is the farthest from the wall surface at both of outermost positions in the second direction, and the closest from the wall surface at an innermost position in the second direction.

In the second aspect, two intake channels having the same size are formed.

According to the second aspect, a total area of the opening is large, a large amount of air can be supplied with the heat dissipating fins, capable of obtaining a more heat dissipating efficiency.

An electronic appliance according to a third aspect is dependent on the second aspect, the edge portion group on the side of the wall surface is farthest from the wall surface at one outermost position in the second direction, and closest from the wall surface at the other outermost position in the second direction.

In the third aspect, one intake channel having a gentle inclination (that is, less difference between each of the edge portions on the side of wall surface) is formed.

According to the third aspect, a less ventilating resistance of the intake channel allows admission of a large amount of air, capable of obtaining a high heat dissipating efficiency.

An electronic appliance according to a fourth aspect is dependent on the second aspect, and the exhaust fan is placed at a position being opposite to the innermost position of the heat dissipating fin group in the second direction.

According to the fourth aspect, it is possible to suck out air from the heat dissipating fin group, capable of obtaining a more heat dissipating efficiency.

An electronic appliance according to a fifth aspect is dependent on the first to the fourth aspects, and the edge portion group of the heat dissipating fin group on the side of the exhaust fan (T1) is placed at equal distances from the wall surface.

In the fifth aspect, a heat dissipating fin being placed at least one outermost position, and having an edge portion farthest from the wall surface becomes shortest while the heat dissipating fin group becomes gradually longer to the depth from the above-described outermost position, and becomes the longest at the heat dissipating fin having the edge portion being the closest from the wall surface.

Thus, it is structured that at the above-described outermost position, air can be easily taken in the heat dissipating fin group while the heat dissipating fin group is gradually longer to the depth from the above-described outermost position, and therefore, it is possible to efficiently dissipate heat by the heat dissipating fin group. As a result, it is possible to heighten heat dissipating efficiency of the heat generating component.

An electronic appliance according to a sixth aspect is dependent on the first aspect, and further comprises other component and a housing. The wall surface is a face of a partition for separating the heat dissipating fin group from the other component, and the housing houses the heat generating component, the base, the heat dissipating fin group, the exhaust fan, the partition, and the other component.

In the sixth aspect, the heat generating component, the base, the heat dissipating fin group, the exhaust fan, the partition, and other component are housed in the housing. The heat dissipating fin group is separated from the other component by the partition.

According to the sixth aspect, it is possible to prevent an adverse effect of the heat from the heat generating component on the other components.

An electronic appliance according to a seventh aspect is dependent on the sixth aspect, and the heat dissipating fin group is arranged only at a part of an area on the base, and at least a part of the other component is arranged on an area on which the heat dissipating fin group is not arranged on the base.

In the seventh aspect, there is an area where the heat dissipating fin group is not arranged on the base, and at least a part of the other component is arranged on the area.

According to the seventh aspect, it is possible to realize a space saving while preventing the heat of the heat dissipating component from being directly transmitted to the other component.

An electronic appliance according to an eighth aspect is dependent on the seventh aspect, and further comprises an exhaust hole and an intake hole both of which are provided to the housing, the exhaust hole is placed at a position being opposite to the heat dissipating fin group via the exhaust fan, and the intake hole is placed at a position being opposite to an opening of an intake channel (QL, QR) formed by the edge portion group on the side of the wall surface of the heat dissipating fin group and the wall surface.

In the eighth aspect, air taken out by the exhaust fan from the heat dissipating fin group is exhausted to the outside of the housing from the exhaust hole. As a result, an atmospheric pressure within the housing is reduced to allow outside air to be taken in the housing through the intake hole. The taken outside air is supplied to the heat dissipating fin group through the intake channel.

According to the eighth aspect, the exhaust hole is placed at a position being opposite to the heat dissipating fin group via the exhaust fan, and the intake hole is placed at a position being opposite to an opening of an intake channel, capable of realizing smooth air intake and exhaust, and heighten heat-dissipating efficiency.

An electronic appliance according to a ninth aspect comprises: a heat generating component; a base connected by heat to the heat generating component; a heat dissipating fin group arranged on the base; and other component. The heat dissipating fin group is arranged at only a part of an area on the base, and at least a part of the other component is arranged at an area where the heat dissipating fin group does not exist on the base.

In the ninth aspect, the heat dissipating fin group is arranged on a base provided in a position being opposite to the heat generating component. There is an area on the base where the heat dissipating fin group is not arranged, and at least a part of the other component is arranged on the area.

According to the ninth aspect, it is possible to prevent an adverse effect of the heat from the heat generating component on the other components while responding to the necessity of miniaturization and an optimal location.

According to the present invention, it is possible to realize a structure in view of the heat from the heat generating component while responding to the necessity of miniaturization and an optimal location.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 10 (B) is a side view showing a structure of the heat dissipating member;

FIG. 10 (C) is a front view showing a structure of the heat dissipating member;

FIG. 14 (B) is a top view showing a heat dissipating member of the other embodiment;

FIG. 14 (C) is a top view showing a heat dissipating member of a further embodiment;

DETAILED DESCRIPTION OF THE PREFERRED EMBODIMENTS

Figure 1:
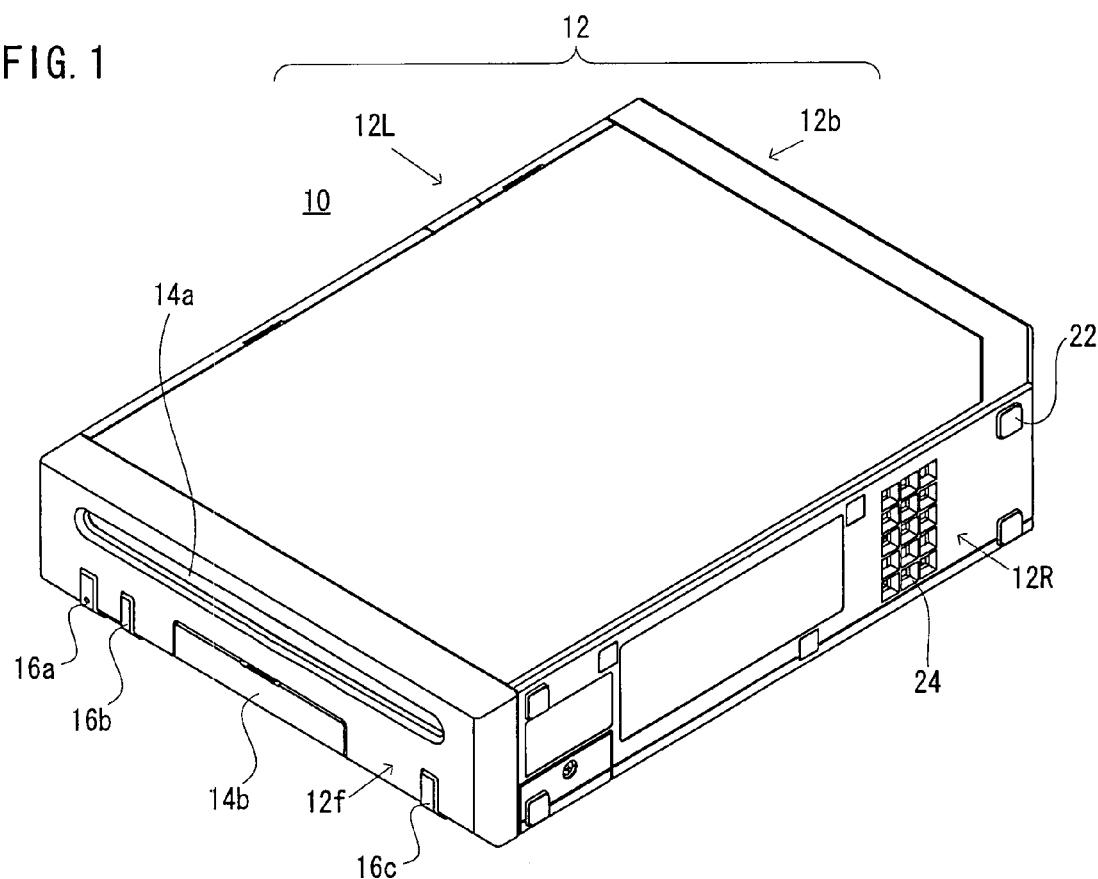
FIG. 1 is a perspective view of one embodiment of the present invention as seen from a front above.
Figure 2:
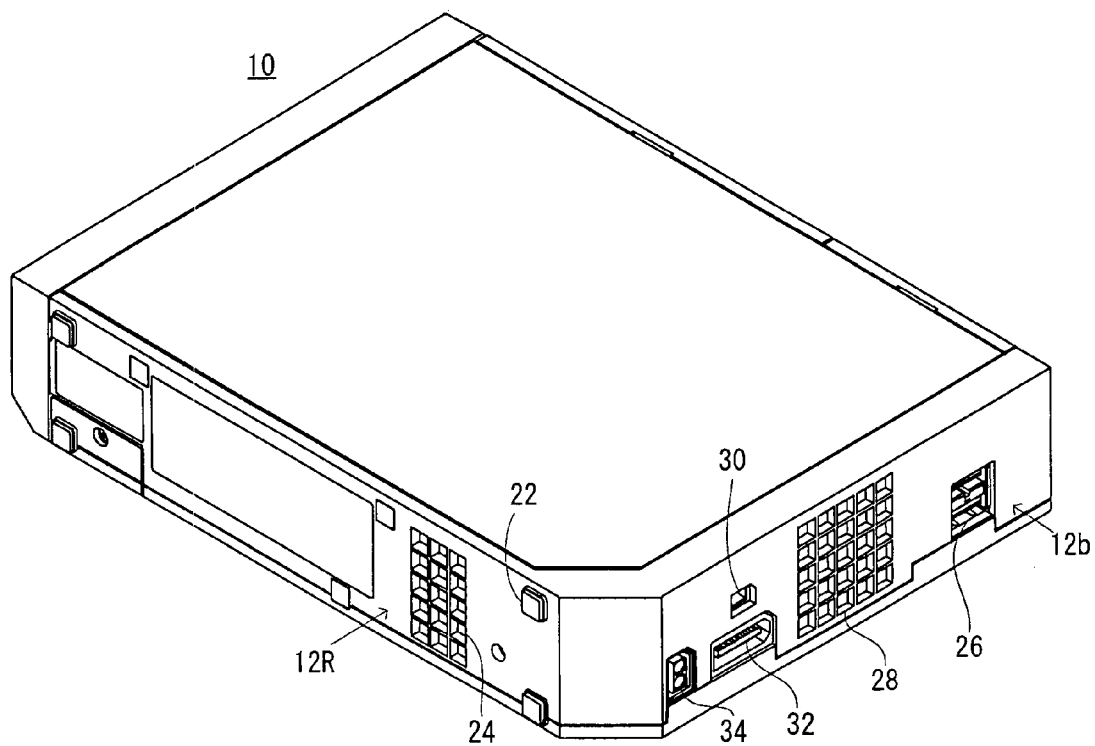
FIG. 2 is a perspective view of FIG. 1 embodiment as seen from rear above.
Figure 3:
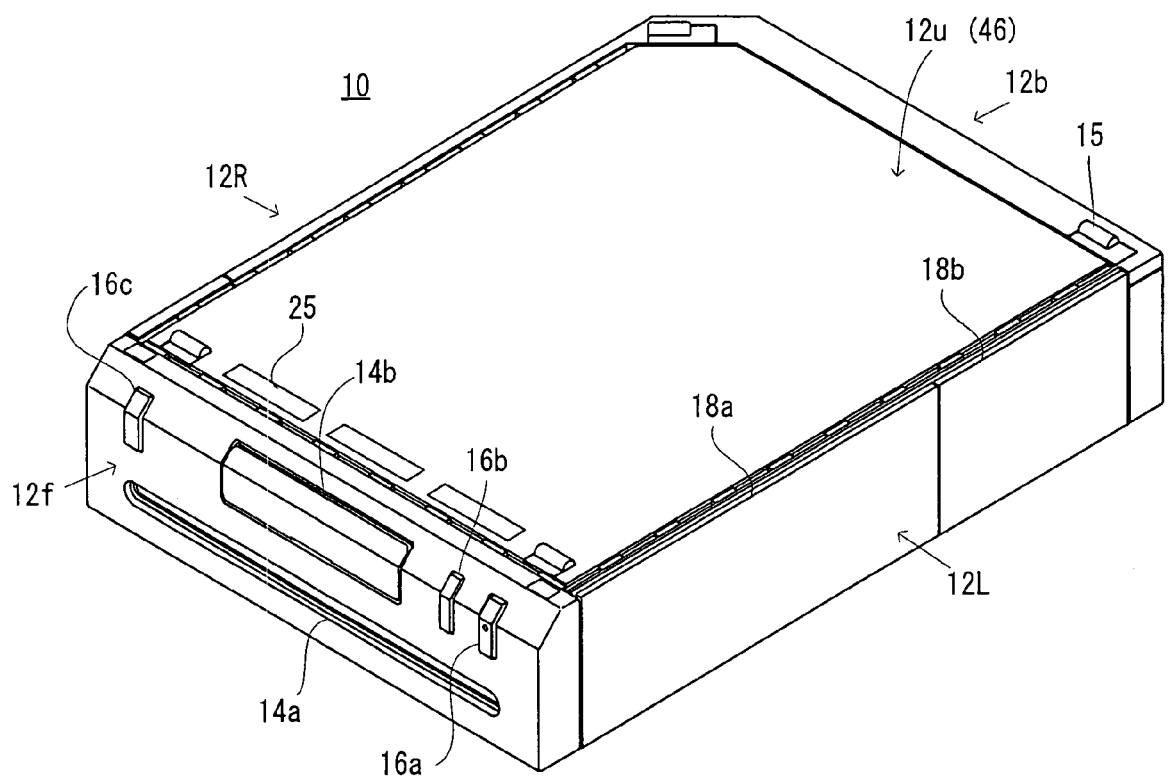
FIG. 3 is a perspective view of FIG. 1 embodiment as seen from front below.

An appearance of a game apparatus 10 of one embodiment of the present invention is shown in FIG. 1-FIG. 3. FIG. 1 is a perspective view of a game apparatus 10 as seen from above front, FIG. 2 is a perspective view of the game apparatus 10 as seen from above back, and FIG. 3 is a perspective view of the game apparatus 10 as seen from front below.

As shown in FIG. 1-FIG. 3, the game apparatus 10 includes a substantially rectangular housing 12. On a front surface 12f of the housing 12, disk slot 14a, a SD card slot cover 14b, a power button 16a, a reset button 16b, a disk eject button 16c, etc. are formed.

On a right side surface 12R of the housing 12, a rubber foot 22, an intake hole 24, etc. are formed. On a back surface 12b, a USB connector 26, an exhaust hole 28, a peripheral connector 30, an AV connector 32, a DC connector 34, etc. are formed. On a bottom surface 12u, a rubber foot 15, an intake hole 25, etc are formed. On a left side surface 12L, an openable closeable covers 18a and 18b are formed.

Figure 4:
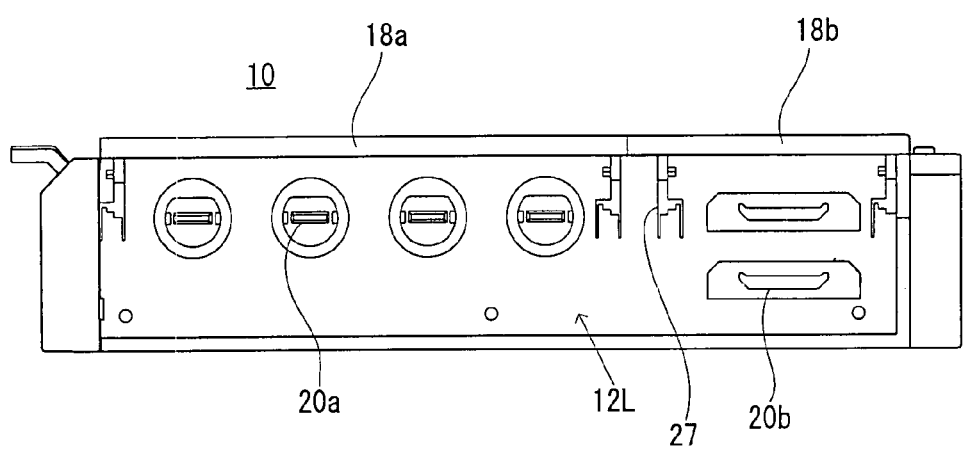
FIG. 4 is an illustrative view showing a hidden part by a cover of a right side surface in FIG. 1 embodiment.

FIG. 4 shows a part hidden under the covers 18a and 18b of the left side surface 12L. Referring to FIG. 4, the left side surface 12L, a connector 20a for various controllers (not illustrated), a memory card slot 20b, an intake hole 27, are provided.

Figure 5:
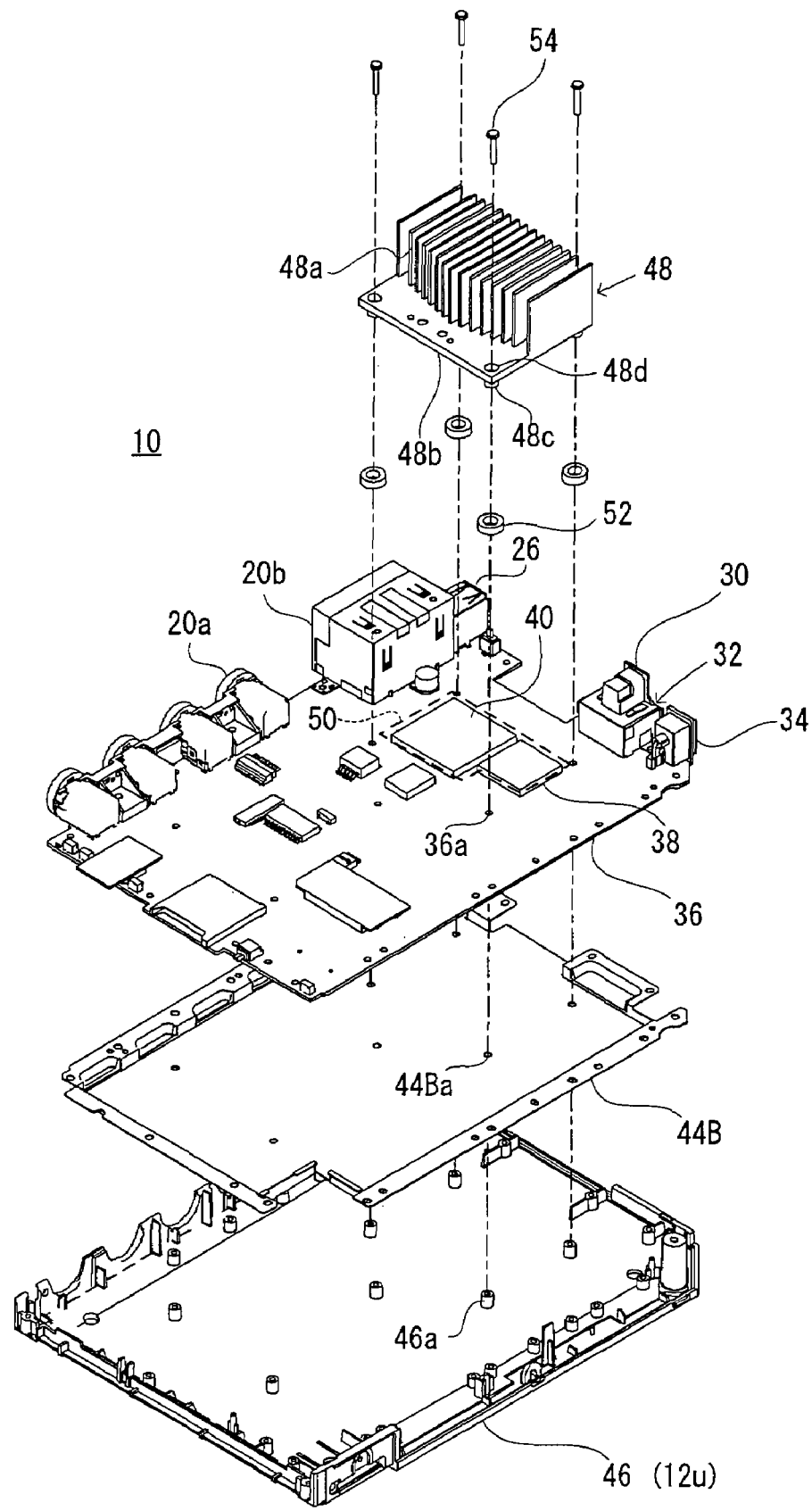
FIG. 5 is an illustrative view showing a part of an assembly process of FIG. 1 embodiment.
Figure 6:
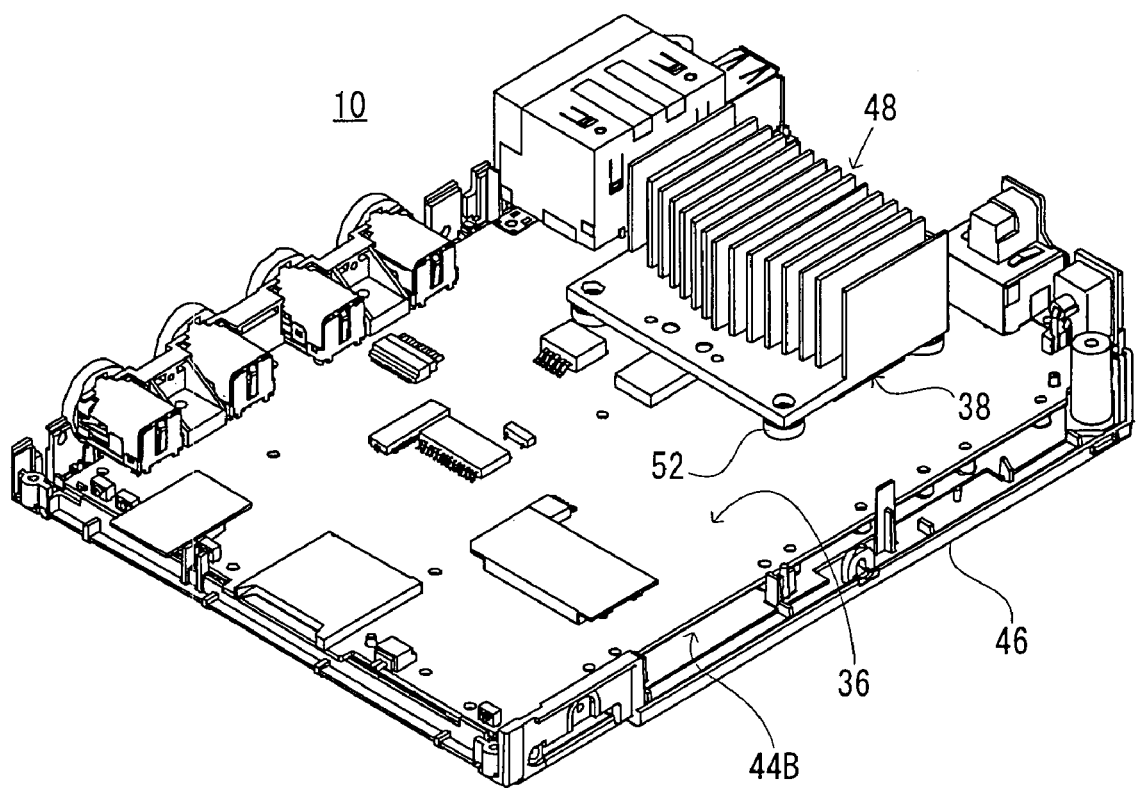
FIG. 6 is a perspective view showing a result of FIG. 5 process (before the completion of the shield)

FIG. 5 shows a part of an assembly process of the game apparatus 10, and FIG. 6 shows a result of the FIG. 5 process.

Referring to FIG. 5 and FIG. 6, the housing 12 constructed as described above includes an electronic component like a CPU 38, a GPU 40, etc. and a substrate 36 mounted with the above-described connectors (20a, 20b, 30, 32 and 34). The substrate 36 is secured with a bottom 46 (corresponding to the bottom surface 12u of the housing 12) via a metal lower shield member 44B.

Each of the CPU 38 and the GPU 40 being an exothermic electronic component has roughly the same thickness, and arranged at the back and the center of the substrate 36. Then, on a top surface of the CPU 38 and GPU 40, a metal (aluminum, for example) heat dissipating member 48 is arranged. The heat dissipating member 48 has a plurality of heat dissipating fins 48a and a base 48b for supporting these. The base 48b takes a shape of rectangular, and has no more size than permit it to exactly cover the CPU 38 and GPU 40. At each of the four corners of the base 48b, a downward protrusion 48c taking a shape of cylinder, and a tapped hole 48d penetrating the base itself and the protrusion 48c are formed. The height of the protrusion 48c is slightly above the thicknesses of the CPU 38 and the GPU 40. That is, the protrusion 48c is a leg for supporting the heat dissipating member 48 at a top surface position of the CPU 38 and the GPU 40.

Figure 10:
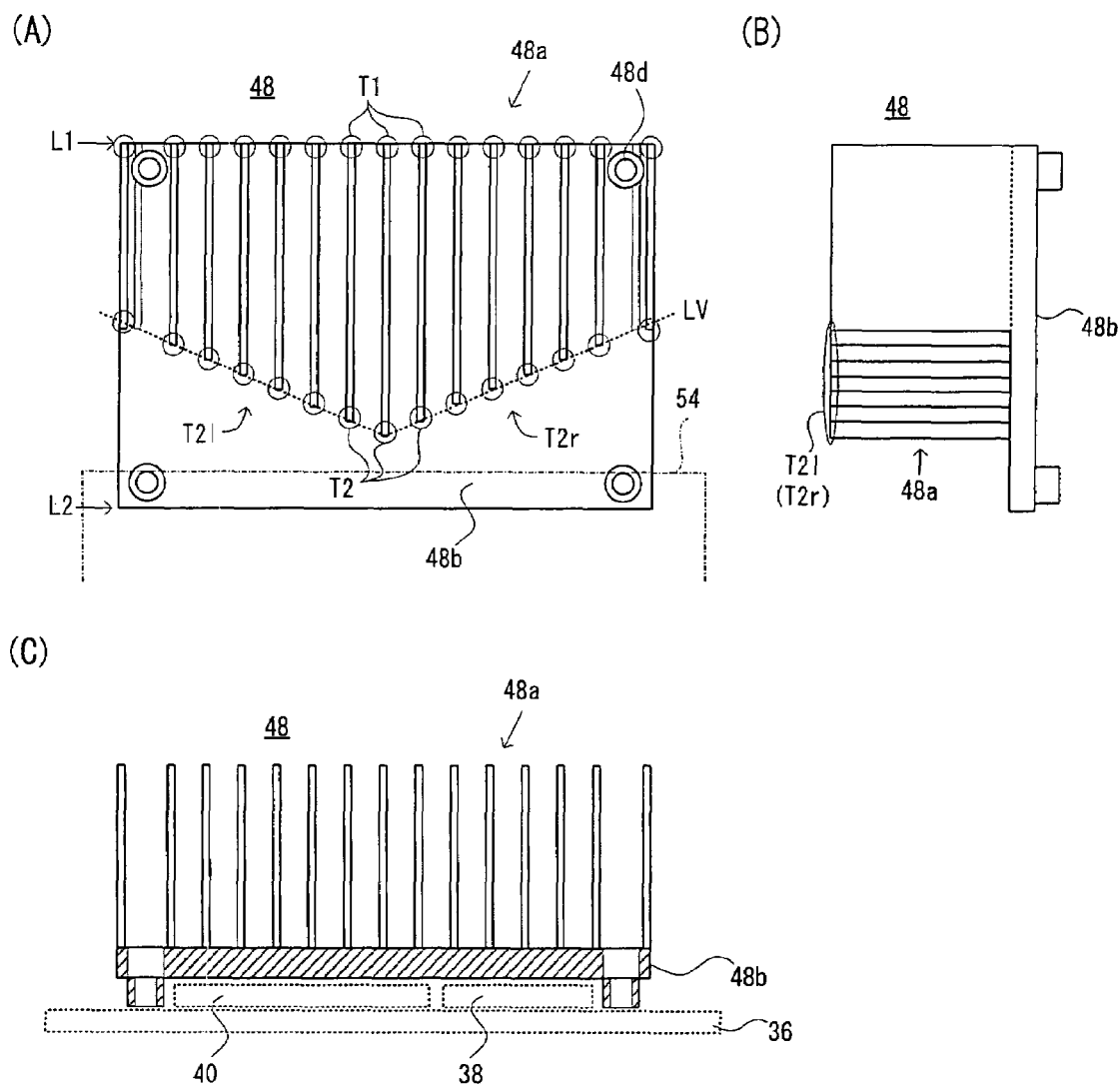
FIG. 10 (A) is a top view showing a structure of a heat dissipating member applied to FIG. 1 embodiment.

Here, a structure of the heat dissipating member 48 is described in detail. The plurality of heat dissipating fins 48a are arranged at roughly fixed intervals in parallel with a short side of the base 48b as shown in FIG. 10 (A). It should be noted that at only the interval between the two heat dissipating fins sandwiching the tapped hole 48d, a wider interval is ensured for attaching a screw 54.

An edge: portion group T1 on one side (upper side) of the plurality of heat dissipating fins 48a is arranged along a long side (top) L1 of the base 48b. With respect to the other long side (lower side) of the base 48b, an edge portion group T2 on the other side (lower side) of the plurality of heat dissipating fins 48a is arranged along a V-shaped line (C1) such that the center thereof is closest, and the right and left thereof is the farthest. Out of the lower edge portion group T2, one along the line of the left side of the V-shaped letter is called a lower left edge portion group T2l, and one along the line of the right side of the V-shaped letter is called a lower right edge portion group T2r.

Thus, as shown in FIG. 10 (B), it is possible to look through the entire lower right edge portion group T2r (or the lower left edge portion group T2l) of the heat dissipating member 48 from the left side surface (or right side surface). Furthermore, the plurality of heat dissipating fins 48a have the same height as one another as shown in FIG. 10(C). It should be noted that the heights of the plurality of heat dissipating fins 48a may be differentiated from one another, or the height of a single sheet of heat dissipating fin may be changed depending on the positions.

Such a heat dissipating member 48 is manufactured in a following process. First, an original member 48A (see FIG. 11 (A)) having a base 48Ab and a plurality of heat dissipating fins 48Aa each having the same length as that of the base 48Ab is molded by extrusion (not illustrated). Next, the original member 48A on which the extrusion molding has been performed is subjected to a press work like cutting away a part of each of the plurality of heat dissipating fins 48Aa with a press block (B1 and B2).

Figure 11:
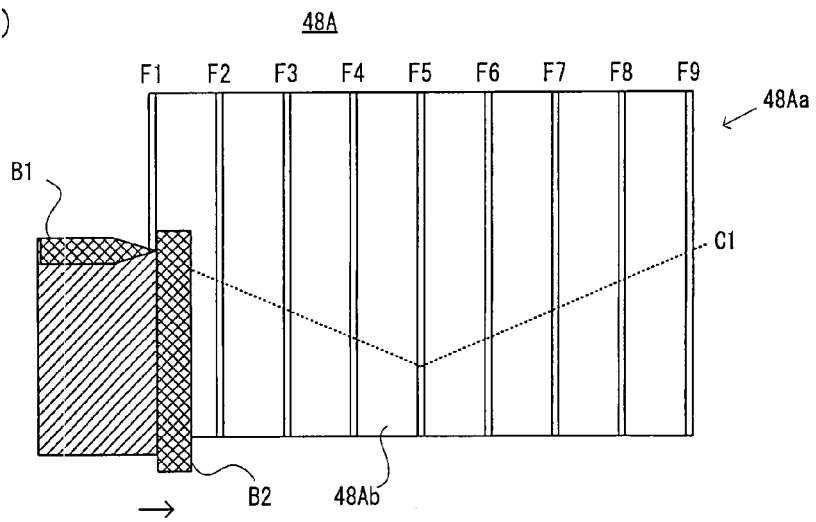
FIG. 11(A)-(C) are illustrative views showing a part of a manufacturing process of the heat dissipating member applied to FIG. 1 embodiment.
Figure 11:
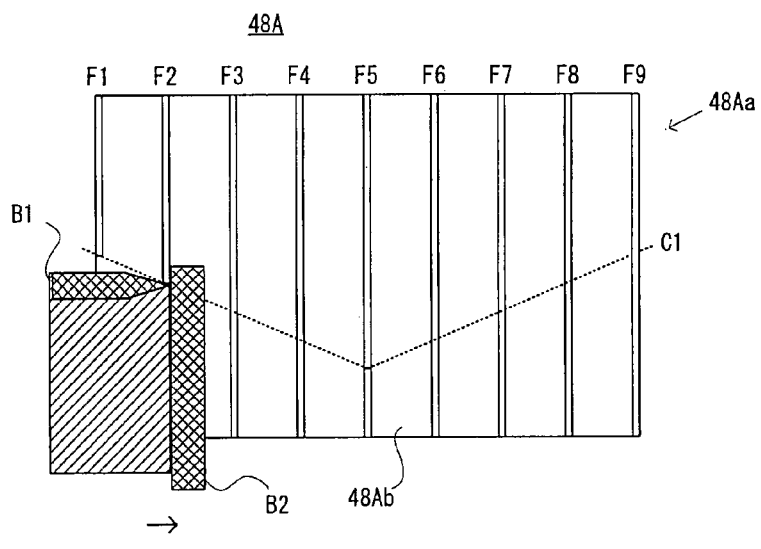
Figure 11:
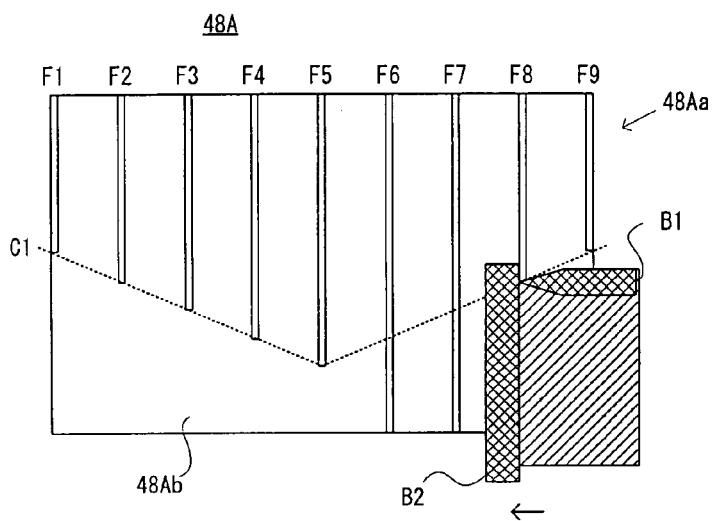

In the press work, first, as shown in FIG. 11 (A), the support member B2 is inserted from the left between the first heat dissipating fin F1 and the second heat dissipating fin F2, and the edge of the cutter member B1 is placed at the left end of the V-shape line C1, and whereby, the heat dissipating fin F1 is cut away by both of the members B1 and B2.

Next, as shown in FIG. 11 (B), the support member B2 is inserted from the left between the second heat dissipating fin F2 and the third heat dissipating fin F3, and the cutter member B1 is moved to the position of the heat dissipating fin F2 along the V-shape line C1, and whereby, the heat dissipating fin F2 is cut away by both of the members B1 and B2. At this time, the cut-away position of the heat dissipating fin F2 is lower than that of the heat dissipating fin F1, and therefore, the heat dissipating fin F1 after the cut-away is never brought into contact with the cutter member B1.

Later, heat dissipating fins F3, F4 . . . are sequentially cut away along the V-shape line C1 in the similar manner. After completion of cut-away of the central heat dissipating fin F5, as shown in FIG. 11 (C), the direction of the cutter member B1 is reversed to sequentially cut away the end of heat dissipating fins F9-F6 along the V-shape line C1 from the right at this time. The plurality of heat dissipating fins 48Aa of the original member 48A thus molded by extrusion is cut away along the V-shape line C1, which allows utilization of an extrusion with more simply shape than in a case that a die casting molding is directly performed on the heat dissipating member 48, capable of reducing a manufacturing cost.

Additionally, as described above, the heat dissipating fins F1-F5 are cut away from the left, and then the heat dissipating fins F9-F6 are cut away from the right. Alternatively, cuttings are simultaneously made from the left and from the right. That is, the F1 and F9 are first cut away, the F2 and F8 are cut away next, the F3 and F7 are then cut away, the F4 and F6 are succeedingly cut away, and the F5 is finally cut away. Thus, it is possible to shorten a manufacturing time.

As schematically shown in FIG. 5, a thermal conduction sheet 50 is inserted between the heat dissipating member 48, and the CPU 38 and GPU 40. The thermal conduction sheet 50 is made of material high in flexibility and thermal conductivity (silicone, or the like), having the top surface thereof be closely brought into contact with the bottom surface of the heat dissipating member 48, and the bottom surface thereof be closely brought into contact with the top surface of the CPU 38 and the GPU 40. The heat of the CPU 38 and the GPU 40 is efficiently transmitted to the heat dissipating member 48 through the thermal conduction sheet 50, and emitted from the heat dissipating member 48. It should be noted that a heat conducting grease like silicone grease may be utilized in place of or in combination with the thermal conduction sheet 50.

The substrate 36 is formed with four through holes 36a respectively corresponding to four tapped holes 48d of the heat dissipating member 48. A lower shield member 44B is formed with four tapped holes 44Ba, and the bottom 46 is formed with four bearings 46a. Also, four ferrite rings 52 are arranged between the heat dissipating member 48 and the substrate 36. The ferrite ring 52 forms an inductor in cooperating with a protrusion 48c, etc. of the heat dissipating member 48 to thereby prevent pulse like charge due to electrostatic discharge from entering the shield 44.

Each of four metalic screws 54 for unitizing the heat dissipating member 48, the substrate 36, the lower shield member 44B, and the bottom 46 is screwed from a corresponding tapped hole 48d into the bearing 46a through a ferrite ring 52, a through hole 36a and a tapped hole 44Ba. Thus, the heat dissipating member 48 is fixed at a position be brought into contact with or be close enough to the top surface of the CPU 38 and GPU 40 as shown in FIG. 6.

Figure 7:
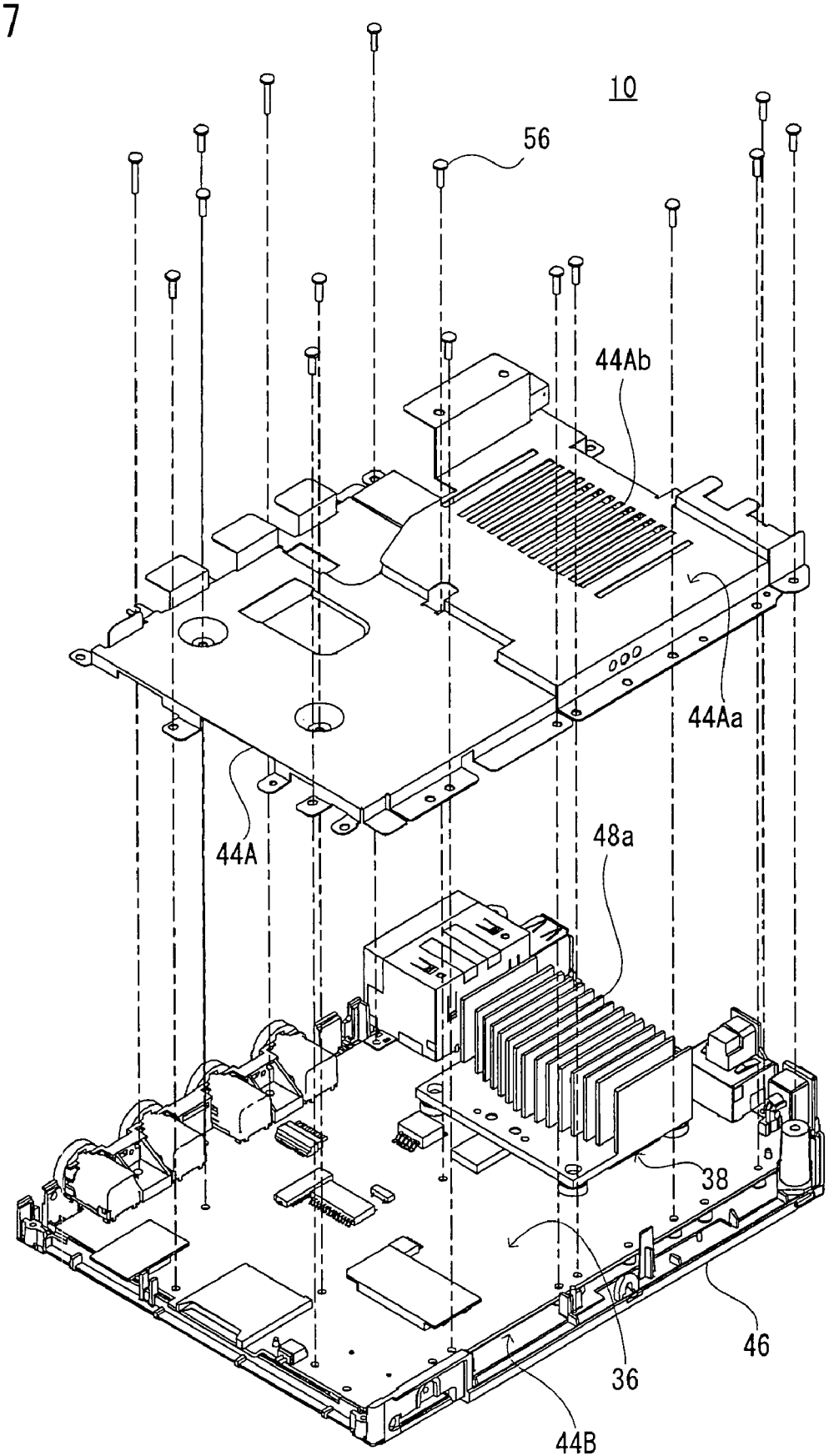
FIG. 7 is an illustrative view showing a process continued from the FIG. 5 process.
Figure 8:
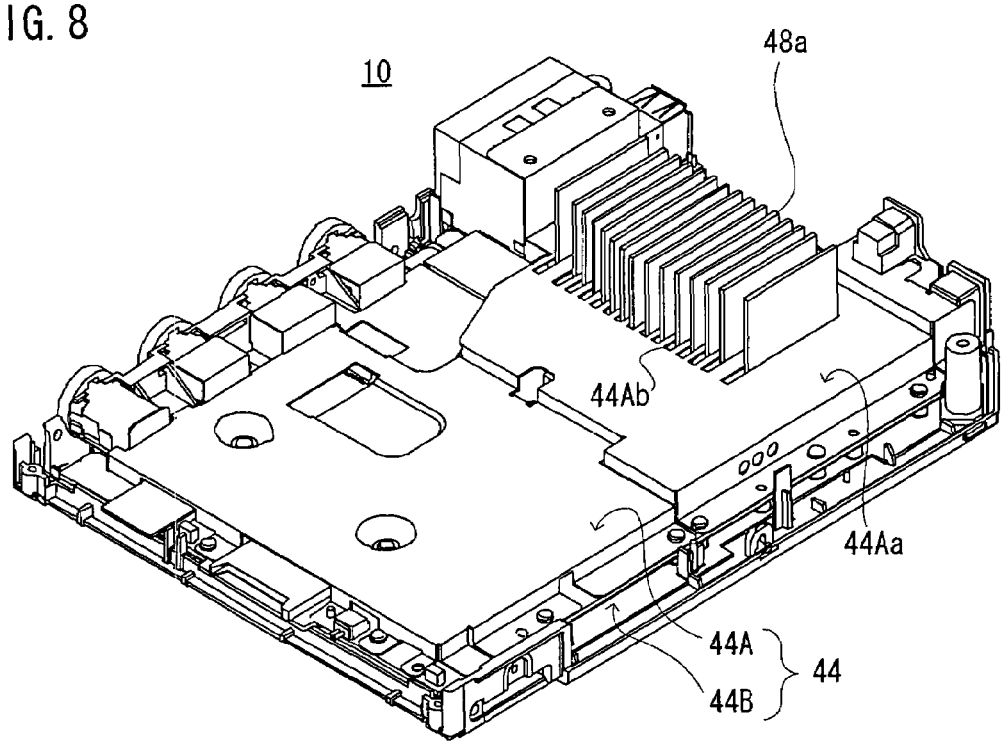
FIG. 8 is a perspective view showing a result of the FIG. 7 process (after completion of the shield)

FIG. 7 shows a process continued from FIG. 5, and FIG. 8 shows the result of the FIG. 7 process. As shown in FIG. 7, after completion of the above-described integrating process, the upper shield member 44A is mounted with the plurality of metalic screws 56 from the top surface side of the substrate 36. As a result, as shown in FIG. 8, the shield 44 is constituted by the upper shield member 44A and the lower shield member 44B to shield the inside electromagnetically.

The upper shield member 44A is formed with a convex portion 44Aa at a position corresponding to the heat dissipating member 48. The convex portion 44Aa has a height corresponding to the height of the base 48b of the heat dissipating member 48, and has slits 44Ab for the plurality of heat dissipating fins 48a on the top surface. The base 48b is directly (or via the thermal conduction sheet 50) brought into contact with the CPU 38, etc. in the shield, and the plurality of heat dissipating fins 48a are exposed from the slits 44Ab to the outside of the shield. Thus, heat emitted by the CPU 38, etc. is efficiently transmitted to the base 48b, and dissipated from the plurality of heat dissipating fins 48a to the outside of the shield. That is, heat is not stopped within the shield, capable of obtain a high heat dissipating efficiency.

Figure 9:
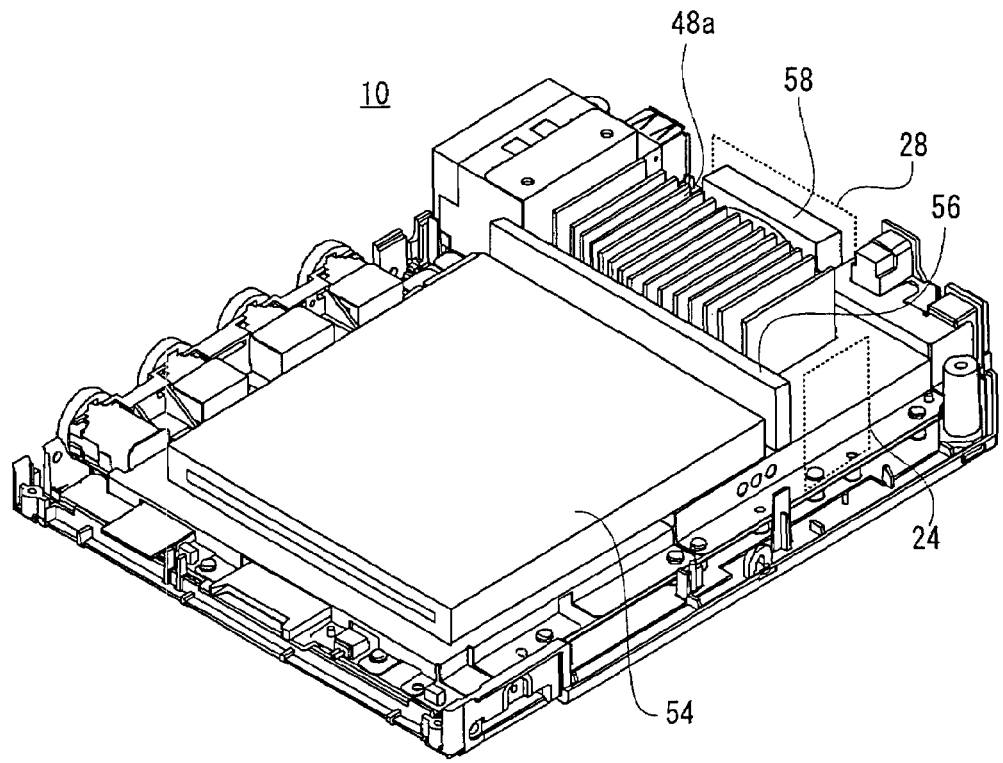
FIG. 9 is an illustrative view showing a state in which a drive unit, a partition, and an exhaust fan are further mounted after the FIG. 7 process.

Then, as shown in FIG. 9, a drive unit 54 is arranged at the front of the plurality of heat dissipating fins 48a on the top surface of the shield 44, that is, at a position corresponding to the disk slot 14a of the front surface 12f of the housing (see FIG. 1). A disk (not illustrated) inserted from the disk slot 14a is housed and driven by the drive unit 54.

Furthermore, since the drive unit 54 and the plurality of heat dissipating fins 48a are proximity to each other, a partition 56 is provided between the drive unit 54 and the plurality of heat dissipating fins 48a. Flow of air heartened by the plurality of heat dissipating fins 48a to the drive unit 54 is prevented by the partition 56, so that overheating of the drive unit 54 can be reduced.

Furthermore, an exhaust fan 58 is provided between the USB connector 26 and the peripheral connector 30 at the back of the shield 44, that is, at a position corresponding to an exhaust hole 28 on the back surface 12b of the housing (see FIG. 2). The air heated by the heat dissipating member 48 is exhausted by the exhaust fan 58 from the exhaust hole 28 to the outside of the housing 12. In accordance with the exhaust, an atmospheric pressure within the housing 12 is reduced to allow cool outside air to be supplied to the inside of the housing 12 through the intake hole 24 on the right side surface 12R and the intake hole 25 on the bottom surface 12u. In a case that the covers 18a and 18b on the left side surface 12L are opened, outside air is also sucked from the intake hole 27.

Figure 12:
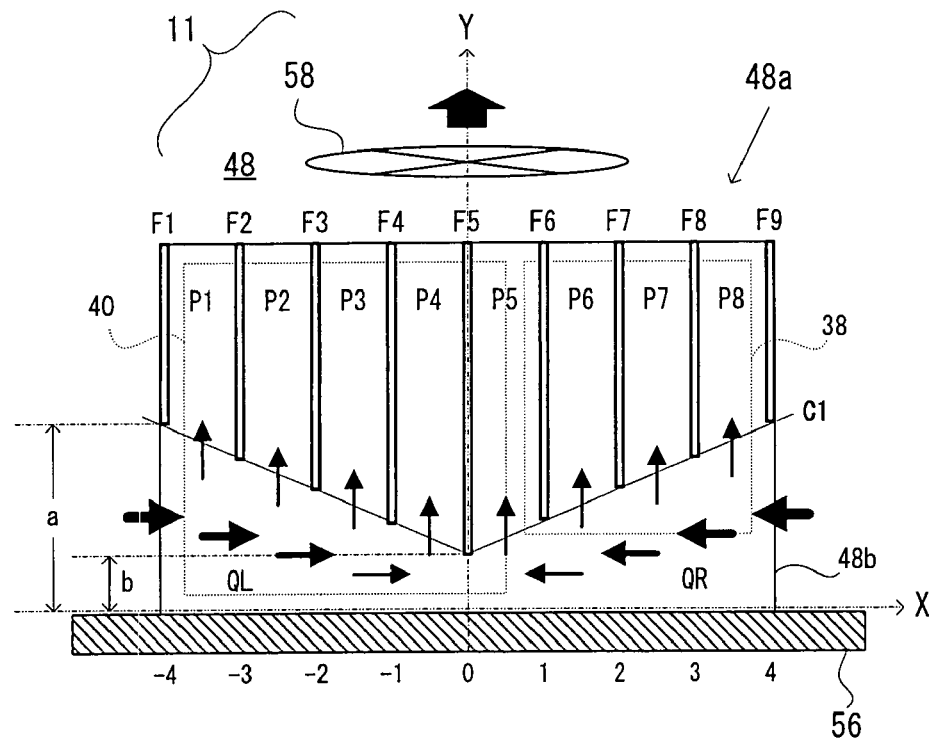
FIG. 12 is an illustrative view showing a flow of air in the heat dissipating member of FIG. 1 embodiment.

At this time, in the vicinity of the plurality of heat dissipating fins 48a, a flow of air shown in FIG. 12 occurs. Referring to FIG. 12, the plurality of heat dissipating fins 48a are arranged such that the longest heat dissipating fin F5 is overlapped with a rotating shaft of the exhaust fan 58. The partition 56 is arranged vertically to the rotating shaft at a position spaced a predetermined distance b from the lower edge of the heat dissipating fin F5.

Additionally, a positional relationship between the plurality of heat dissipating fins 48a and the exhaust fan 58 is not limited to one shown in FIG. 12, and may be changeable in view of adding other components thereto.

Here, when a Y axis is upwardly defined along the exhaust fan 58, and an X axis is defined in the right direction along the partition 56, the height of the lower edge of the longest heat dissipating fin F5 is described to be "Y=b", and the height of the lower edge of the shortest heat dissipating fin F1 (or F9) is described to be "Y=a". Furthermore, the horizontal positions of the heat dissipating fin F1-F9 can be described like X=−4, X=−3, . . . , X=0, . . . , X=4.

Between the plurality of heat dissipating fins 48a and the partition 56, an intake channel QL is formed along the X axis by the lower left edge portion group T21 and the partition 56, and an intake channel QR is formed along the X axis by the lower right edge portion group T2r and the partition 56. Additionally, these two intake channels QL and QR form a single M-shaped channel. On the other hand, the heat dissipating fins F1-F9 form the eight heat dissipating channels P1-P8 along the Y axis.

Outside air enters the heat dissipating member 48 from two positions including a space (left opening) between the heat dissipating fin F1 and partition 56 and a space (right opening) between the heat dissipating fin F9 and the partition 56. The air entered from the left opening flows through the intake channel QL in the right direction (X direction), and the air entered from the right opening flows through the intake channel QR in the left direction (−X direction).

The intake channel QL is narrower in the right direction, and therefore, the amount of air flowing through each position (X=−4, −3, . . . , 0) of the intake channel QL is less as the air progresses to the right. This means that the air entered from the left opening roughly equally flows into the heat dissipating channels P1-P4. Similarly, the intake channel QR is narrower in the left, and therefore, the amount of air flowing through each position (X=4, 3, . . . , 0) of the intake channel QR is less as the air progresses to the left. This means that the air entered from the right opening roughly equally flows into the heat dissipating channels P8-P5.

As understood from the above description, the lower edges of the plurality of heat dissipating fins 48a (F1-F9) are cut away along the V-shaped line C1 in the heat dissipating member 48 of this embodiment to thereby form the M-shaped channel (intake channels QL and QR) between the plurality of heat dissipating fins 48a and the partition 56, allowing intake of the large amount of air through the large openings at the right and left. Furthermore, the left half (intake channel QL) of the M-shaped channel is narrower in the right direction, and the right half (intake channel QR) thereof is narrower to the left direction, and therefore, the taken air evenly is spread through the plurality of heat dissipating fins 48a (heat dissipating channels P1-P8). Thus, a high heat dissipating advantage can be obtained.

Figure 13:
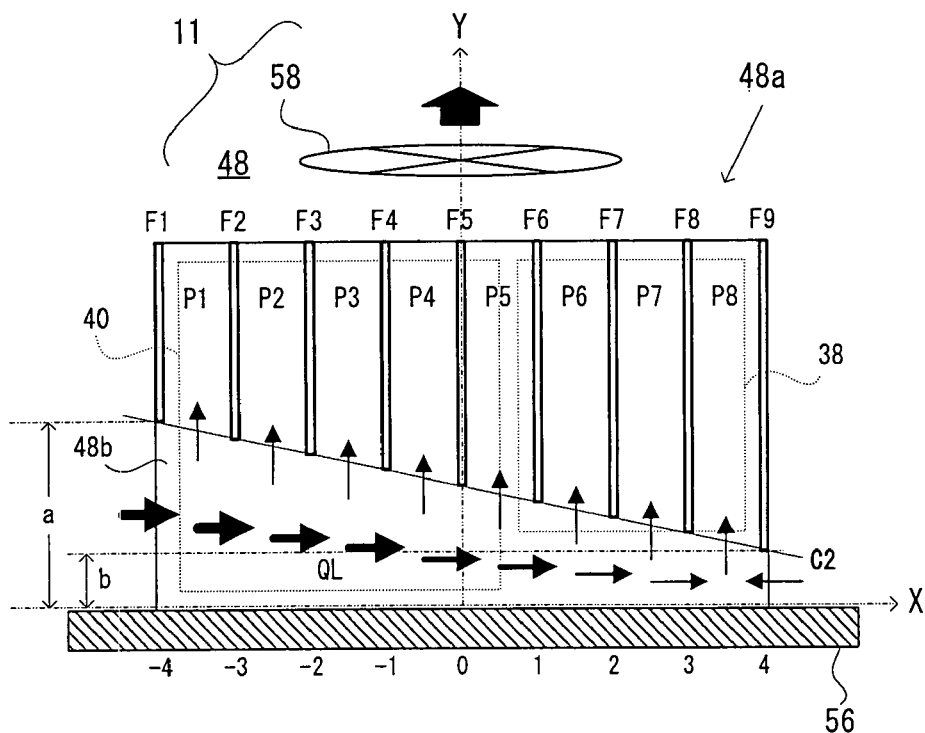
FIG. 13 is an illustrative view showing a flow of air in a heat dissipating member of another embodiment.

Additionally, in the heat dissipating member 48 of this embodiment, the lower edge portion group (T2) of the plurality of heat dissipating fins 48a is cut away along the V-shaped line C11 as shown in FIG. 12. On the other hand, as shown in FIG. 13, the lower edge portion group (T2) of the plurality of heat dissipating fins 48a may be cut away along the single line C2 inclined with respect to the partition 56, and an intake hole may be formed at a position corresponding to the notch on the left side surface 12L of the housing. In this case also, a large amount of air can mainly be taken from the left opening (the space between the heat dissipating fin F1 and the partition 56) into the intake channel QL, and the air can evenly be spread into the entire heat dissipating fin 48a (heat dissipating channels P1-P8).

According to FIG. 13 configuration, the differences between the lower edge portion of the plurality of heat dissipating fins 48a can be smaller than that shown in FIG. 12 while the lengths of spaces a and b are ensured as in FIG. 12. That is, it is possible to make the slant of the single line C2 gentle.

Therefore, in accordance with the configuration in FIG. 13, it is possible to make a ventilating resistance less, and make an air flow from the above described intake hole on the left side surface 12L of the housing to the intake channel QL smooth. Thus, it is possible to obtain a high heat dissipating effect.

Also, it may be possible that the space b shown in FIG. 13 is further large to make the slant of the single line C2 gentler.

Figure 14:
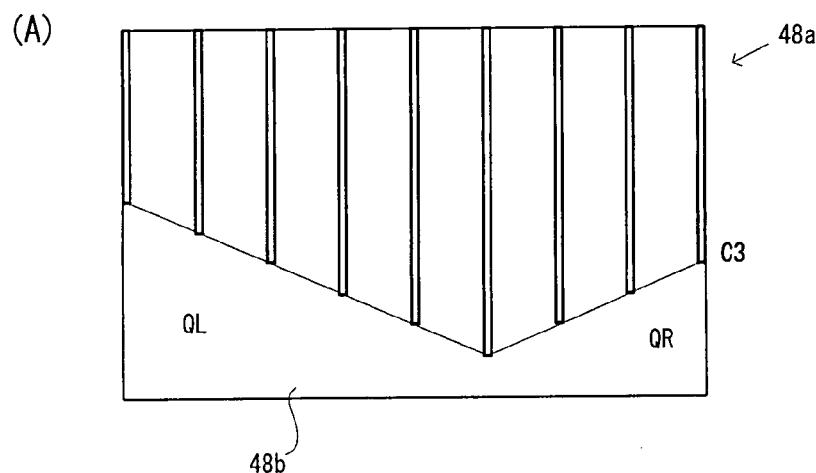
FIG. 14 (A) is a top view showing the heat dissipating member of another embodiment.
Figure 14:
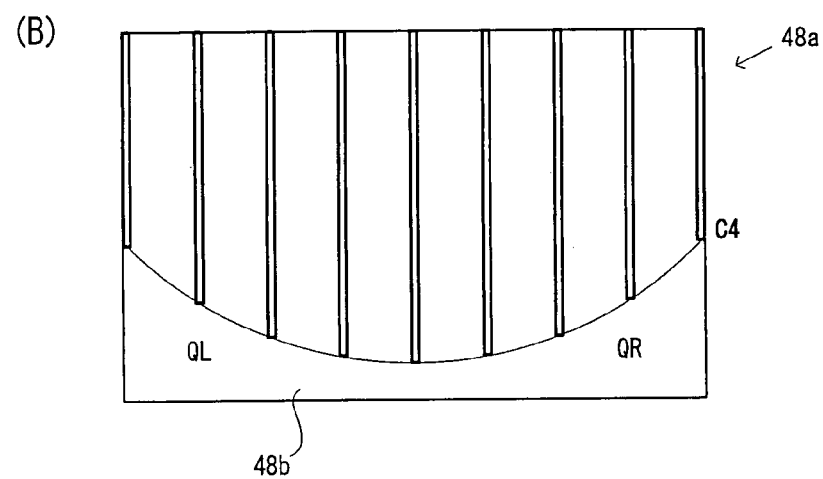
Figure 14:
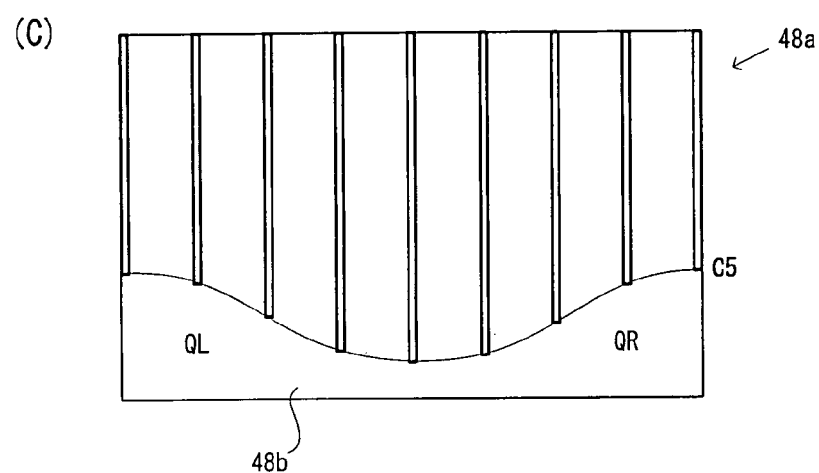

In addition, the V-shaped line C1 at a time of cutting away the lower edges of the plurality of heat dissipating fins 48a (F1-F9) may be left-right asymmetry as shown in FIG. 14(A). Furthermore, the pattern of cutting away may be U-shaped (or angular) as shown in FIG. 14 (B) without being limited to the V-shaped. In a case of utilizing a curve, the curvature may be changed depending on the position as shown in FIG. 14 (C).

Generally, if the lower edge portion group of the plurality of heat dissipating fins 48a is cut away along a curve or a line which monotonously decreases on the left side and monotonously increases on the right side with respect to a minimum value, a large amount of air can be taken from the large openings at the right and left, and can be spread into the entire of the plurality of heat dissipating fins 48a, capable of obtaining a high heat dissipating effect.

Figure 15:
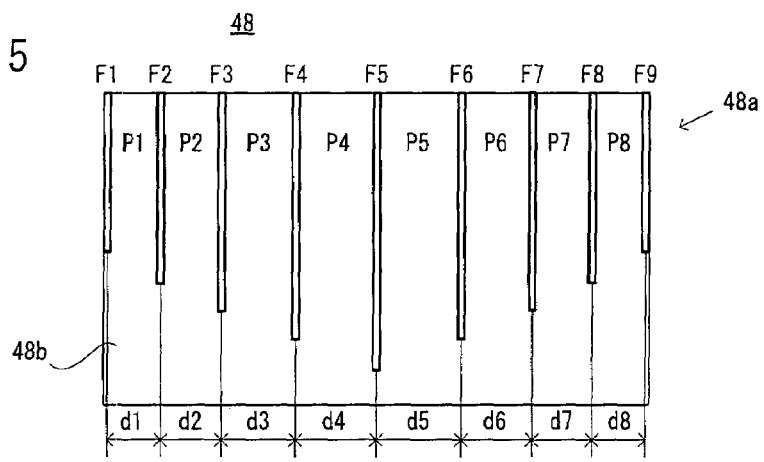
FIG. 15 is a top view showing a heat dissipating member of another embodiment.

Furthermore, in this embodiment, the spaces of the plurality of heat dissipating fins 48a (space between each of the heat dissipating channels P1-P8) are equal, but may be changeable depending a position in the X direction. One example is shown in FIG. 15. Referring to FIG. 15, each of the widths d1-d8 respectively corresponding to the heat dissipating channels P1-P8 is longest at the channel P4 and P5 adjacent to the longest heat dissipating fin F5, and becomes narrower as the distance is away from the heat dissipating fin F5 (that is, d1<d2<d3<d4, d5>d6>d7>d8).

Generally, a fluid like air is difficult to flow in a longer channel in the same width. Here, it is though that it is possible to uniform the flow of air by making the heat dissipating channel P1-P8 have a width corresponding to the length. It should be noted that by making the width of the heat dissipating channel wider, a heat dissipating area becomes small, and therefore, the heat dissipating advantage is not always heightened.

Figure 16:
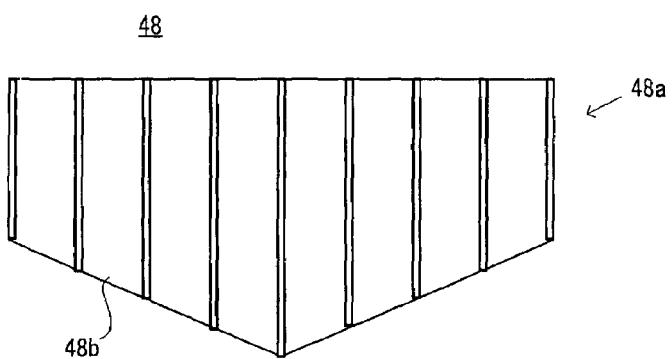
FIG. 16 is a top view showing a heat dissipating member of the other embodiment.

Furthermore, on the base 48b of the heat dissipating member 48, there is an area on which the heat dissipating fins 48a are not arranged as a result of the cut-away, but such an empty area may be removed as shown in FIG. 16. However, in this embodiment, the CPU 38 and the GPU 40 also exist directly under the empty area, and the empty area also functions so as to transmit heat of the CPU 38, etc. to the plurality of heat dissipating fins 48a. Furthermore, since a part of the drive unit 54 is placed above the empty area (see FIG. 10(A)), the empty area functions so as to prevent the heat of the CPU 38, etc. from being directly transmitted to the drive unit 54. In such a case, it is preferable that the empty area is not removed.

Figure 17:
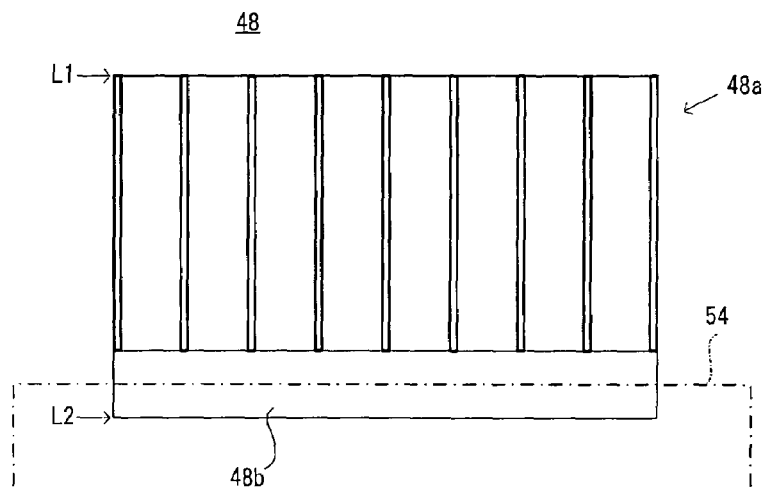
FIG. 17 is a top view showing a heat dissipating member of a further embodiment.

It should be noted that the function of the above-described empty area is independent of the shape of the notch pattern (by extension, the alignment of the plurality of heat dissipating fins 48a). Thus, for example as shown in FIG. 17, the lower edge portion group of the plurality of heat dissipating fins 48a may simply be cut away in parallel with the bottom L2 of the base 48b. By arranging a part of components such as the drive unit 54, etc. in the empty area, it is possible to realize space saving.

Furthermore, in this embodiment, the edge portion group T1 of the plurality of heat dissipating fins 48a on the side of the exhaust fan 58 is arranged on the line vertical to the plurality of heat dissipating fins 48a (top L1 of the base 48b) (see FIG. 10 (A)), but may be arranged along a inclined line or a curve with respect to the plurality of heat dissipating fins 48a.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic appliance, comprising:
a heat generating component;
a base provided in a position being opposite to said heat generating component;
a heat dissipating fin group which includes a plurality of fins arranged on said base in a manner that each of heat dissipating fins extends in a first direction and is arranged in spaced relation in a second direction crossing said first direction, edge portions of said plurality of heat dissipating fins constituting edge portion groups on the side of a wall surface and on the side of an exhaust fan; and
an exhaust fan and the wall surface being opposite to each other with which said heat dissipating fin group is sandwiched in said first direction, wherein
the edge portion group of said heat dissipating fin group on the side of said wall surface is farthest from said wall surface at least one outermost position in said second direction and closest from said wall surface at a specific position different from said one outermost position in said second direction, and is farther from said wall surface between said specific position and said one outermost position as said one outermost position is approached.

2. An electronic appliance according to claim 1, wherein the edge portion group on the side of said wall surface is the farthest from said wall surface at both of outermost positions in said second direction, and the closest from said wall surface at an innermost position in said second direction.

3. An electronic appliance according to claim 1, wherein the edge portion group on the side of said wall surface is farthest from said wall surface at one outermost position in said second direction, and closest from said wall surface at the other outermost position in said second direction.

4. An electronic appliance according to claim 2, wherein said exhaust fan is placed at a position being opposite to the innermost of said heat dissipating fin group in said second direction.

5. An electronic appliance according to claim 1, wherein the edge portion group of said heat dissipating fin group on the side of said exhaust fan is placed at equal distances from said wall surface.

6. An electronic appliance according to claim 1, further comprising
an other component and a housing, wherein
said wall surface is a face of a partition for separating said heat dissipating fin group from said other component, and
said housing houses said heat generating component, said base, said heat dissipating fin group, said exhaust fan, said partition, and said other component.

7. An electronic appliance according to claim 6, wherein said heat dissipating fin group is arranged only at a part of an area on said base, and
at least a part of said other component is arranged on an area on which said heat dissipating fin group is not arranged on said base.

8. An electronic appliance according to claim 7, further comprising
an exhaust hole and an intake hole both of which are provided to said housing, wherein
said exhaust hole is placed at a position being opposite to said heat dissipating fin group via said exhaust fan, and
said intake hole is placed at a position being opposite to an opening of an intake channel formed by the edge portion group on the side of said wall surface of said heat dissipating fin group and said wall surface.

9. An electronic appliance according to claim 1, wherein a space between said heat dissipating fins is changed depending on a position in said second direction.

10. An electronic appliance according to claim 9, wherein the space of said heat dissipating fins is wider as said specific position is approached.

11. An electronic appliance, comprising:
a heat generating component;
a base provided in a position being opposite to said heat generating component;
a heat dissipating fin group arranged on said base; and
an electronic apparatus, wherein
said heat dissipating fin group is arranged at only a part of area on said base, and at least a part of said electronic apparatus is arranged at an area where said heat dissipating fin group does not exist on said base.

12. An electronic appliance according to claim 11, further comprising
a shield member placed on said base, and formed with a slit group through which said heat dissipating fin group passes, wherein
said electronic apparatus is placed on said shield member.

13. An electronic appliance according to claim 12, further comprising
a wall member placed between said heat dissipating fin group and said electronic apparatus on said shield member.

14. An electronic appliance, comprising:
a heat generating component;
a heat dissipating fin group which includes a plurality of fins and provided in a position being opposite to said heat generating component;
an exhaust fan provided in a position being opposite to said heat dissipating fin group;
a wall provided at a position being opposite to said heat dissipating fin group on the reverse side of said exhaust fan; wherein
the length of said heat dissipating fin group is different in such a manner that a cross section of an air channel formed by said heat dissipating fin group and said wall surface is larger on an entrance side of said air channel and smaller at the middle thereof.

* * * * *